United States Patent
Gallagher

(10) Patent No.: US 6,246,251 B1
(45) Date of Patent: Jun. 12, 2001

(54) TEST PROCESS AND APPARATUS FOR TESTING SINGULATED SEMICONDUCTOR DIE

(75) Inventor: Wesley C. Gallagher, San Ysidro, CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/298,659

(22) Filed: Apr. 23, 1999

Related U.S. Application Data

(60) Provisional application No. 60/082,966, filed on Apr. 24, 1998.

(51) Int. Cl.$^7$ .................................................. G01R 1/04
(52) U.S. Cl. ...................... 324/765; 324/158.1; 209/573
(58) Field of Search .................................. 324/765, 754, 324/755, 158.1; 209/573, 73

(56) References Cited

U.S. PATENT DOCUMENTS

| | | | |
|---|---|---|---|
| 3,384,236 | * 5/1968 | Best et al. ............................. | 209/573 |
| 3,579,102 | * 5/1971 | Keating ................................. | 324/73 |
| 3,584,741 | * 6/1971 | Edward ................................. | 209/573 |
| 3,750,878 | * 8/1973 | Atchley et al. ....................... | 209/573 |
| 5,150,797 | * 9/1992 | Shibata ................................. | 209/573 |
| 5,177,439 | 1/1993 | Liu et al. . | |
| 5,313,156 | * 5/1994 | Klug et al. .......................... | 324/158.1 |
| 5,374,888 | * 12/1994 | Karasawa ............................. | 324/765 |
| 5,475,317 | 12/1995 | Smith . | |
| 5,497,103 | * 3/1996 | Ebert et al. .......................... | 324/754 |
| 5,519,332 | 5/1996 | Wood et al. . | |
| 5,589,781 | 12/1996 | Higgins et al. . | |
| 5,629,631 | 5/1997 | Perry et al. . | |
| 5,634,267 | 6/1997 | Farnworth et al. . | |
| 5,756,370 | 5/1998 | Farnworth et al. . | |
| 5,767,689 | 6/1998 | Tokuno et al. . | |
| 5,796,264 | 8/1998 | Farnworth et al. . | |
| 5,848,705 | * 12/1998 | Gianpaolo et al. .................. | 209/571 |
| 5,973,505 | * 10/1999 | Strid et al. .......................... | 324/754 |

* cited by examiner

*Primary Examiner*—Safet Metjahic
*Assistant Examiner*—Jimmy Nguyen
(74) *Attorney, Agent, or Firm*—Ostrolenk, Faber, Gerb & Soffen, LLP

(57) ABSTRACT

A known good die testing apparatus for pre-package testing singulated semiconductor die includes a plurality of test nests for receiving at least one of the singulated semiconductor die, each test nest including first and second portions which are movable away from one another to receive the singulated die, the first portion having a probe card coupled thereto which includes at least one needle for electrically connecting to a first side of the semiconductor die and at least one first edge connector electrically coupled to a respective needle; and at least one test unit in movable communication with respect to the test nests, the test unit being adapted to removably engage the first edge connector of the test nests, the test unit including at least one electrical circuit for performing electrical tests on the semiconductor die.

30 Claims, 15 Drawing Sheets

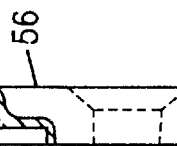
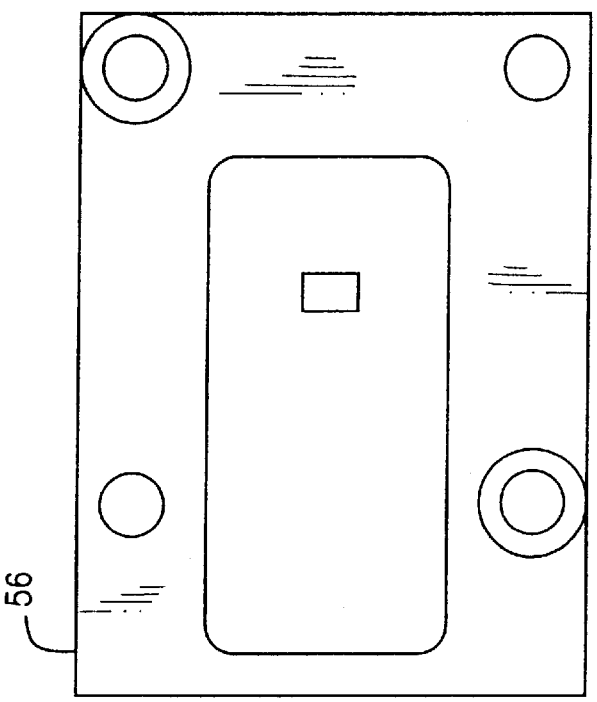
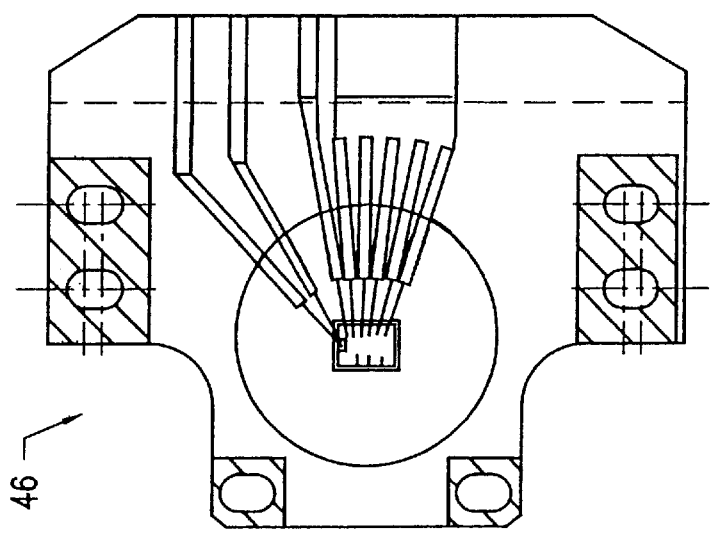
FIG. 7i
FIG. 7h
FIG. 7g

TEST PROCESS AND APPARATUS FOR TESTING SINGULATED SEMICONDUCTOR DIE

CROSS REFERENCE TO RELATED APPLICATION

This application is based on and claims priority to U.S. Provisional Patent Application No. 60/082,966, filed Apr. 24, 1998, entitled TEST PROCESS AND APPARATUS FOR TESTING SINGULATED SEMICONDUCTOR DIE, the entire disclosure of which is incorporated herein by reference.

BACKGROUND OF THE INVENTION

1. Field of the Invention

This invention relates to an apparatus and a process for testing semiconductor device die before the die are assembled into a package.

2. Related Art

Semiconductor die are conventionally made in large area wafers such that hundreds or thousands of identical individual die are simultaneously made. Such die can be diodes, transistors, MOSFETs, IGBTs and the like. After the wafer (containing the unseparated die) is completed, it is placed in an apparatus which probes and tests the die for certain characteristics (called "wafer probe" or "probe" test). Those die which fail the probe test for any reason are normally marked with an ink dot or the like.

The die are then separated from one another within the wafer as by a singulating operation (such as sawing). Usually the separated (or singulated) die of the wafer are held together by an adhesive backing. The separated wafer is then placed in an assembly operation in which only unmarked "good" die are picked up and then deposited into a package (or stored in a tape and reel assembly) which will have one or more of the die.

Frequently die which pass the probe test in the wafer are damaged during the die separation process. Furthermore, the wafer probe test is not a full and accurate test of the acceptability of the die for their intended purpose because the presence of the surrounding die reduces testing accuracy and militates against running certain tests, such as high current tests.

Test measurements at wafer probe must be conducted below about 7 amperes in order to prevent device damage. At wafer probe testing, current is injected through one or more fine probe needles (which measure a few thousands of an inch in diameter). If a probe needle is misaligned, currents above about seven amperes cause localized damage to the semiconductor die which may manifest in latent reliability defects.

With wafer probe test, electrical connection to one side of the wafer (for example, the drain metal) is made by way of a mounting vacuum chunk. If good intimate electrical contact with the drain metal of the wafer is not obtained (due to small particles or a non-planar wafer profile), then probe current may flow laterally through the silicon substrate or the back metalization of the wafer. Such current flow increases the measured series resistance of the die being probed, thereby causing an inaccurate Rdson and Vsd reading.

Although drain and gate leakage tests (such as Idss and Igss) may be performed at wafer probe on certain types of die (for example, FET die), the measured values may not reflect the leakage values which would be found in a final semiconductor package because the leakage values easily change after the wafers have gone through the wafer probe test and the die are separated.

After wafer probe, wafers are handled extensively and exposed to environmental micro-contamination and moisture. Further, the wafers are singulated (sawed) in an aqueous system and then dried. The sawing process can cause chip-outs along the cut that can affect the electrical field termination around the periphery of the die, thereby causing leakages to increase (for example, Idss leakage). Furthermore, the handling and exposure can create surface leakage paths across the die.

Wafer probe testing has not previously been used to perform avalanche testing of die due to current constraints, lead lengths, equipment maintenance and difficulty in making contact with the die. Thus, it has not been possible to test the reverse breakdown of a die at wafer probe.

Although temperature testing at high temperatures has been performed during wafer probe, temperature testing at low temperatures is not performed. This is so because multiple temperature testing at wafer probe would require repeated contacting of the surface of the die which would likely result in damage to the metalization of the die.

Wafer probe testing is unsuited for dynamic switch testing of transistors (for example, IGBTs) and UIS testing due to the current constraints and interference between adjacent die in the wafer.

Due to the testing limitations and inaccuracies discussed above during wafer probe, some die pass wafer probe and are treated as "good die" when in fact they are defective. Conversely, some die fail wafer probe test and are treated as bad die when in fact a more accurate test would have found them to be "good die".

As a result, good die may be discarded and improperly unmarked "good" die are frequently assembled in package form and defects discovered only when the packaged device is fully tested. This process is, of course, wasteful since good die are discarded and the defective die are discovered only after the costly packaging operation is completed.

U.S. Pat. No. 5,475,317 is directed to a singulated semiconductor die tester and method for performing burn-in electrical tests. A die carrier 4 is employed which includes a plurality of elastomeric probes 4a in alignment which bond pads 2a of a die 2. Allegedly, the elastomeric probes 4a have been designed to continuously and repetitively establish electrical continuity with bond pads 2a of different die 2. An alignment template 6 is disposed proximate to the die 2 to ensure that the die is properly aligned with the carrier 4. The '317 patent discloses that burn-in testing may be utilized with the die tester by inserting it and the die into heating and/or cooling chambers to achieve testing at minus 55° C. to 125° C., for example. A TEC cooler 30 (FIG. 5) is also disclosed as being effective in achieving temperature testing of the die 2.

U.S. Pat. No. 5,589,781 discloses a die carrier apparatus 700 which includes a carrier block 702 for receiving a chip alignment plate 770 in which a semiconductor chip under test is disposed. A probe card 800 includes a plurality of needles 310 for contacting the semiconductor chip when the probe card 800 is positioned above the alignment plate 770. Probe traces 802 provide electrical connection between the needles 310 and the periphery of the probe card 800.

U.S. Pat. No. 5,629,631 is directed to an interface card and probe card for testing unpackaged semiconductor die. The patent discloses a probe card assembly 20 having an interface card 22, a probe card 24, and a carousel 26 disposed between the interface card 22 and the probe card 24. The probe card 24 is not fixed to the carousel 26 and may be precisely stepped such that it aligns with a semiconductor wafer to be tested. The interface card 22 is formed from a ceramic body which include contact pads 56 on a top layer, an internal layer having wiring metalization 58 and a bottom layer having contact pads 60 making contact with a connector. The contact pads 56 on the top layer are offset from the contact pads 60 on the bottom layer such that they are closer to the periphery of the interface card 22. The wiring metalization 58 connects the contact pads 56 with the contact pads 60.

The '631 patent also discloses a guard circuit for reducing current leakage in the probe card 24. The guard circuit includes guard line metalization 82 on either side of contact pads 74 and 76 of a top layer 68 and guard line metalization 84 on either side of signal lines 80 on a second layer 70. A third layer 72 includes metal pads 86 directly below signal lines 80 and line metalization 84. A central opening is included in the probe card 24 for receiving standard semiconductor wafer probes 78 for contacting the semiconductor wafer under test.

The above listed patents do not adequately address the problems in the art. Indeed, it would be desirable to increase the accuracy of tests for "known-good-die" in a wafer, and, in particular, it would be desirable to test the singulated die before the die are mounted in packages or housings.

SUMMARY OF THE INVENTION

In accordance with the invention, a novel apparatus and process is provided for testing singulated die in a test bed which simulates a device package and provides test beds connected to the die electrode. This permits a die test sequence which closely mimics the test of the die after packaging. Thus, die which pass an initial wafer probe test can now be tested after singulation for parameters which are more similar to those which are now tested only after packaging.

A known good die testing apparatus for pre-package testing singulated semiconductor die according to the invention includes:

a plurality of test nests for receiving at least one of the singulated semiconductor die, each test nest including first and second portions which are movable away from one another to receive the singulated die, the first portion having a probe card coupled thereto which includes at least one needle for electrically connecting to a first side of the semiconductor die and at least one first edge connector electrically coupled to a respective needle; and at least one test unit in movable communication with respect to the test nests, the test unit being adapted to removably engage the first edge connector of the test nests, the test unit including at least one electrical circuit for performing electrical tests on the semiconductor die.

The first and second portions are adapted to move away from one another to a substantially open position to receive or release the singulated die and to move towards one another to a substantially closed position such that the at least one needle electrically connects to the first side of the semiconductor die.

Preferably, the test nest further includes a base lead for electrically connecting to a second side of the semiconductor die, opposite to the first side; and a second edge connector electrically coupled to the base lead, the test unit being further adapted to removably engage the first and second edge connectors of the test nests.

The test nest of the present invention may further include at least one guide fixed to one of the first and second portions and slidably engaging the other of the first and second portions such that the portions may attain the open and closed positions. Preferably, the guide of each test nest includes at least one rod fixed to and extending substantially vertically from the first portion, the second portion including a rod engaging portion for slidably engaging the at least one rod. The rod engaging portion may be an aperture extending through a part of the second portion.

Each test nest may further include at least one biasing element operable to bias the first and second portions towards one another such that, without external force applied thereto, the portions will tend to attain the substantially closed position. Preferably, the biasing element includes at least one spring having one end fixed to the first portion and an opposite end fixed to the second portion.

Each test unit preferably includes first and second engagement members which are oppositely disposed and movable toward one another to achieve a substantially open or closed position, each engagement member including at least one terminal for connecting to a respective edge connector of the probe card when the engagement members are in the substantially closed position. The first and second engagement members may form a pair of jaws for electrically coupling the electrical circuit of the test unit to the semiconductor die when the jaws are in the closed position. The terminals may include a movable plunger which resiliently engages the respective edge connectors.

According to the invention, each test unit may perform a substantially different test on each semiconductor die when respective test nests move into communication therewith; and each semiconductor die need only be contacted one time by the respective needles yet undergoing a plurality of tests.

The known good die testing apparatus may include a rotatable plate having a periphery, wherein each test nest is disposed at the periphery of the plate and is rotated therewith; and the test units are disposed in a substantially stationary position proximate to the periphery of the plate such that the test nests may communicate with each test unit as they are rotated.

The rotatable plate may include a lifter adapted to bias the first and second portions away from one another as the plate is rotated into a predetermined position such that the semiconductor die may be transferred to or removed from the base leads of respective test nests. The lifter or the test nests may include a cam surface adapted to bias the first and second portions away from one another as the plate is rotated into the predetermined position.

According to the invention, at least one of the test units includes circuitry to perform at least one of the following tests: avalanche testing, reverse breakdown testing, dynamic switch testing, turn on time testing, turn off time testing, high temperature testing, low temperature testing, Rds on testing, and UIS testing.

The invention may further include at least one cover member coupled to at least one of the first and second portions of at least one of the test nests, the cover member including a port for fluid communication with a source of substantially inert gas, the cover member being sized and shaped to define a volume at least enclosing the first side of the semiconductor die such that a substantially inert gas environment is obtained when the source of substantially inert gas releases inert gas into the volume.

The singulated die which fail the parameter tests are marked and are eliminated from the packaging operation.

Those singulated die which pass the parameter test can then be stored in a conventional tape and reel assemblage for subsequent use in a packaging operation.

It has been found that the yield of known-good-die produced by the present invention exceeds 99.99%, thus reducing the number of rejected packages which are produced with the die tested by the present invention.

BRIEF DESCRIPTION OF THE DRAWINGS

For the purpose of illustrating the invention, there are shown in the drawing forms which are presently preferred, it being understood, however, that the invention is not limited to the precise arrangements and instrumentalities shown.

FIGS. 7a–i show various components of a preferred test nest in accordance with the invention;

DETAILED DESCRIPTION OF THE PREFERRED EMBODIMENTS

Figure 1:
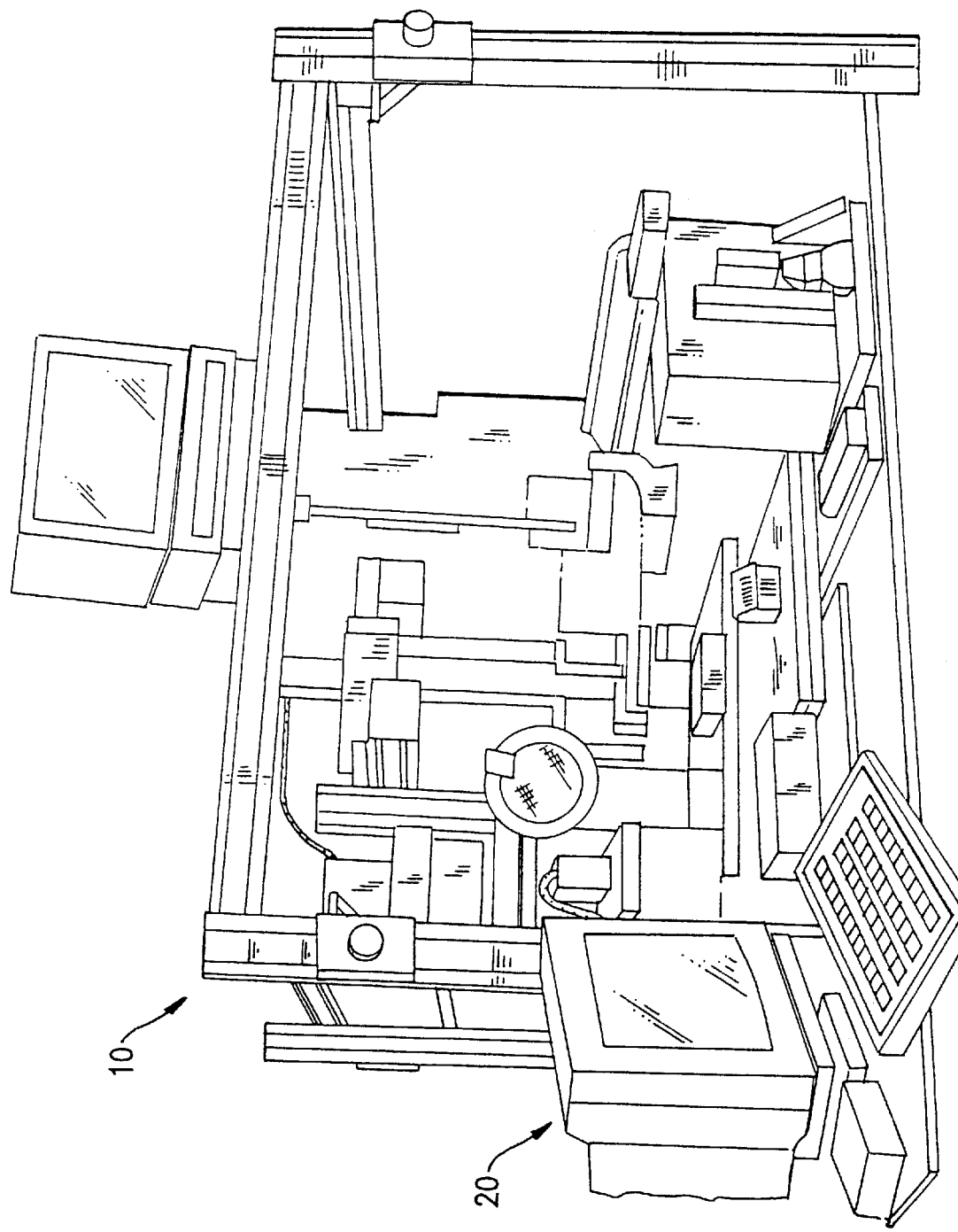
FIG. 1 shows a known good die device handler in accordance with the present invention.

Referring now to the drawings wherein like numerals indicate like elements, there is shown in FIG. 1 a known good die (KGD) handler 10 in accordance with the present invention. The KGD handler 10 is an automated semiconductor die handling apparatus which operates under the control of a computer 20, for example a personal computer.

Figure 2:
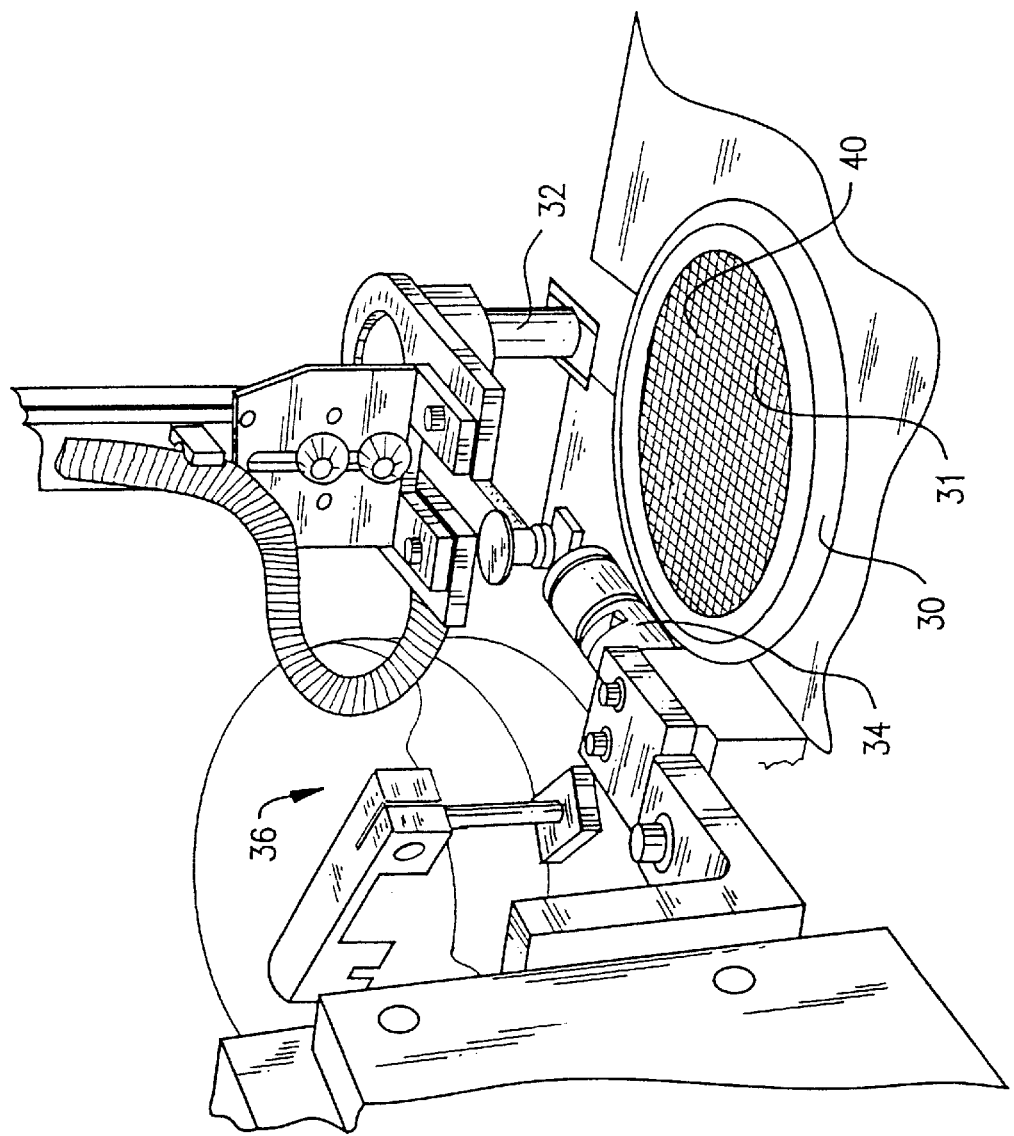
FIG. 2 is a more detailed view of the handler of FIG. 1.

Referring to FIG. 2, the KGD handler 10 includes a wafer station 30 on which a wafer 31 is placed. As shown, the wafer 31 has been singulated (such as by sawing) such that a plurality of semiconductor die 40 making up the wafer 31 are separated and may be individually removed from the wafer station 30. As is known in the art, a pick and place apparatus 32 may be utilized to remove the individual die 40 from the wafer station 30 and place the die 40 in another location.

The KGD handler 10 may also include a die flipping device 34 (which may include an optical monitoring function) which receives the individual die 40 from the wafer station 30 by way of the pick and place apparatus 32. The die flipping device 34 is operable to flip the die and over such that an opposite surface is accessible. The pick and place apparatus 32 operates to deliver the flipped die 40 from the die flipping device 34 to a testing unit 36. Those skilled in the art will appreciate that if the die need not be flipped, the die flipping device 34 may be omitted or not activated.

Figure 3:
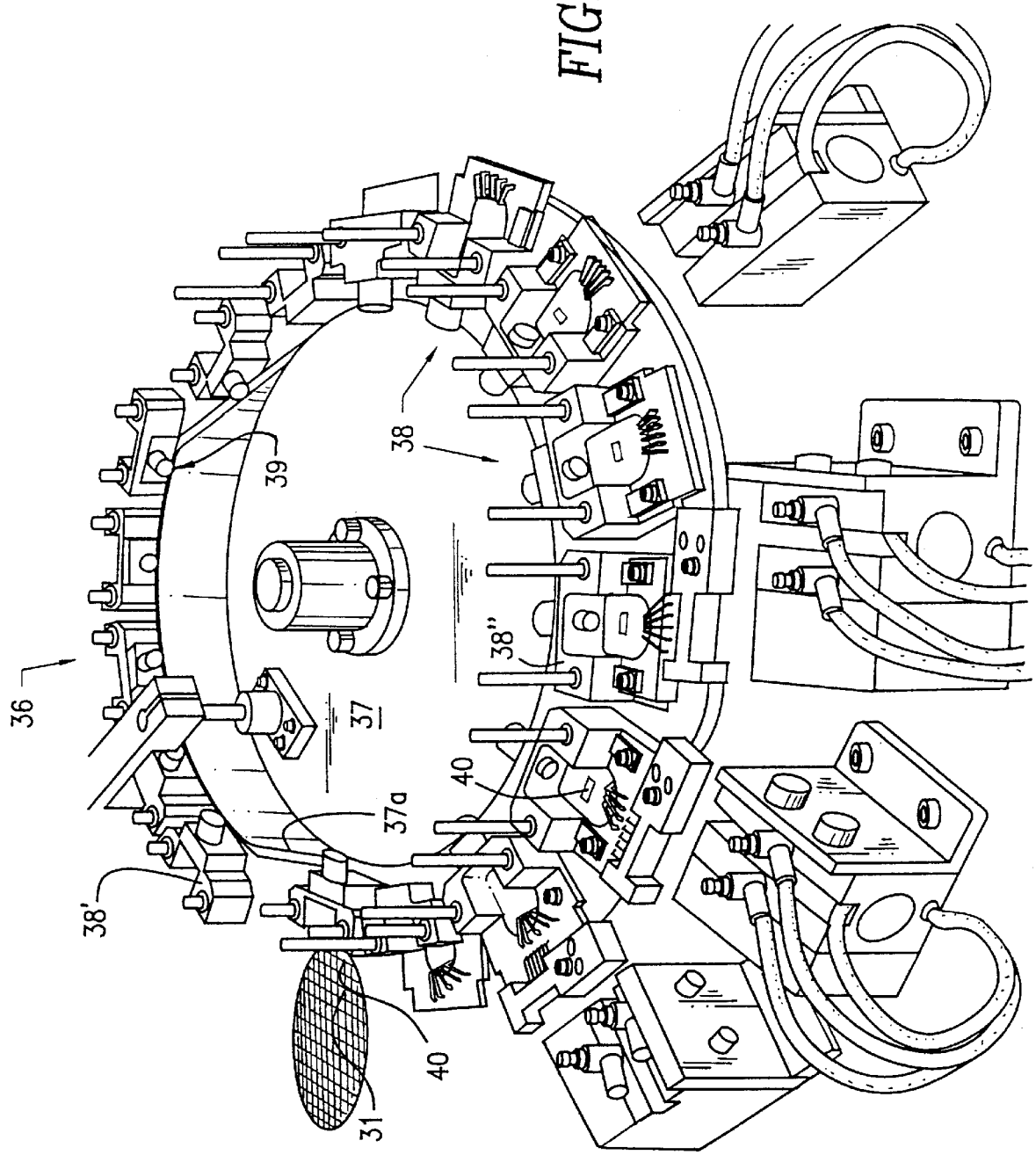
FIG. 3 shows a perspective view of a testing unit of the handler of FIG. 1.

Referring to FIG. 3, the testing unit 36 includes a table 37 having a periphery which may be rotated with respect to its center. Along the periphery of the table 37 a plurality of test stations 38 are disposed. The test stations are operable to receive the die 40 from the pick and place apparatus 32.

Some test stations 38' are in an open configuration and ready to receive die 40. Other test stations 38" are in a closed configuration having already received a die 40.

In order to obtain an open configuration, the test stations 38 include a roller 39 which rides along a cam surface 37a of the table 37. When a particular test station 38 has rotated to a position where the cam surface 37a has a substantial height, the test station will achieve its open configuration by way of the roller 39 engaging the height of the cam surface 37a. When the test station 38 rotates to a position where the cam surface 37a does not have a substantial height, the test station 38 will achieve its closed configuration 38".

Figure 4:
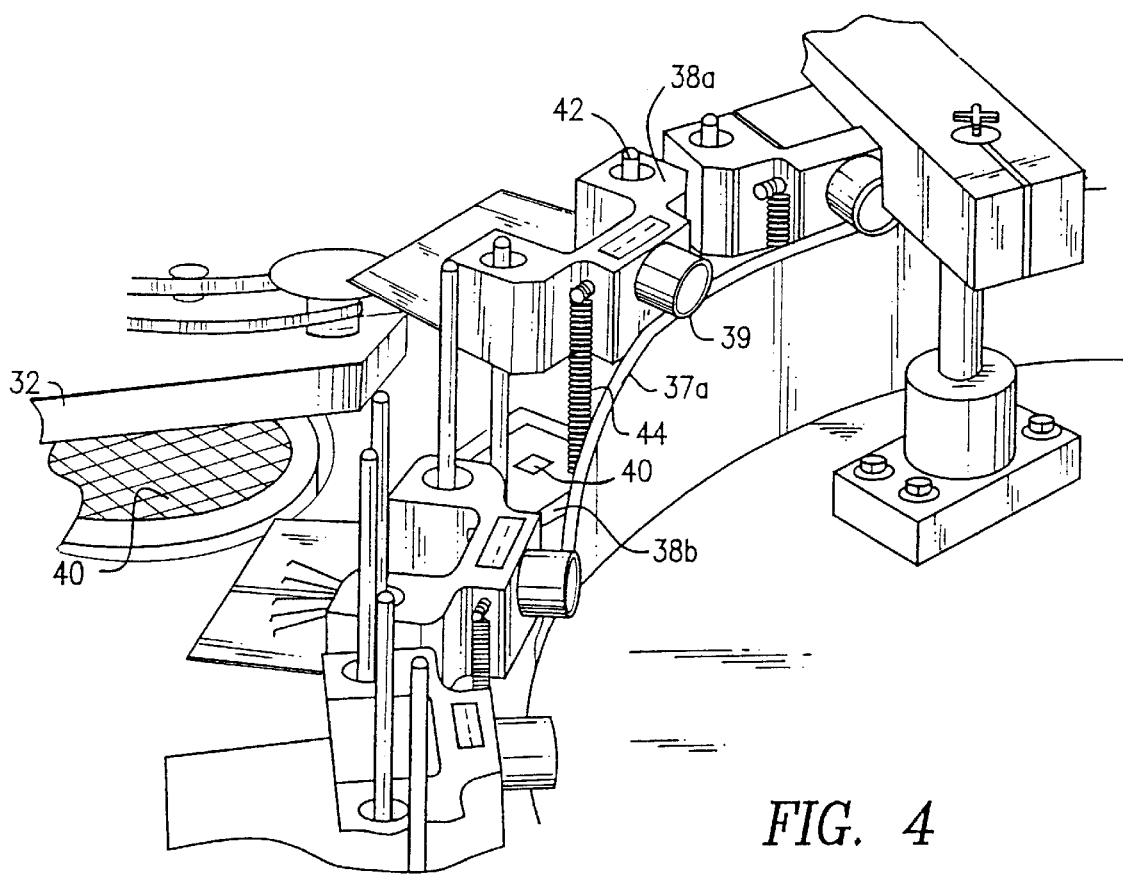
FIG. 4 shows a perspective view of test stations of the testing unit of FIG. 3.

Referring to FIG. 4, each test station preferably includes a pair of shafts 42 along which an upper portion 38a of the test station 38 slides. One or more springs 44 cause the upper portion 38a of the test station 38 to be biased towards a lower portion 38b of the test station 38. When the upper portion 38a of the test station moves from its open configuration to its closed configuration, the die 40 is sandwiched between the upper portion 38a and the lower portion 38b of the test station 38.

Figure 5:
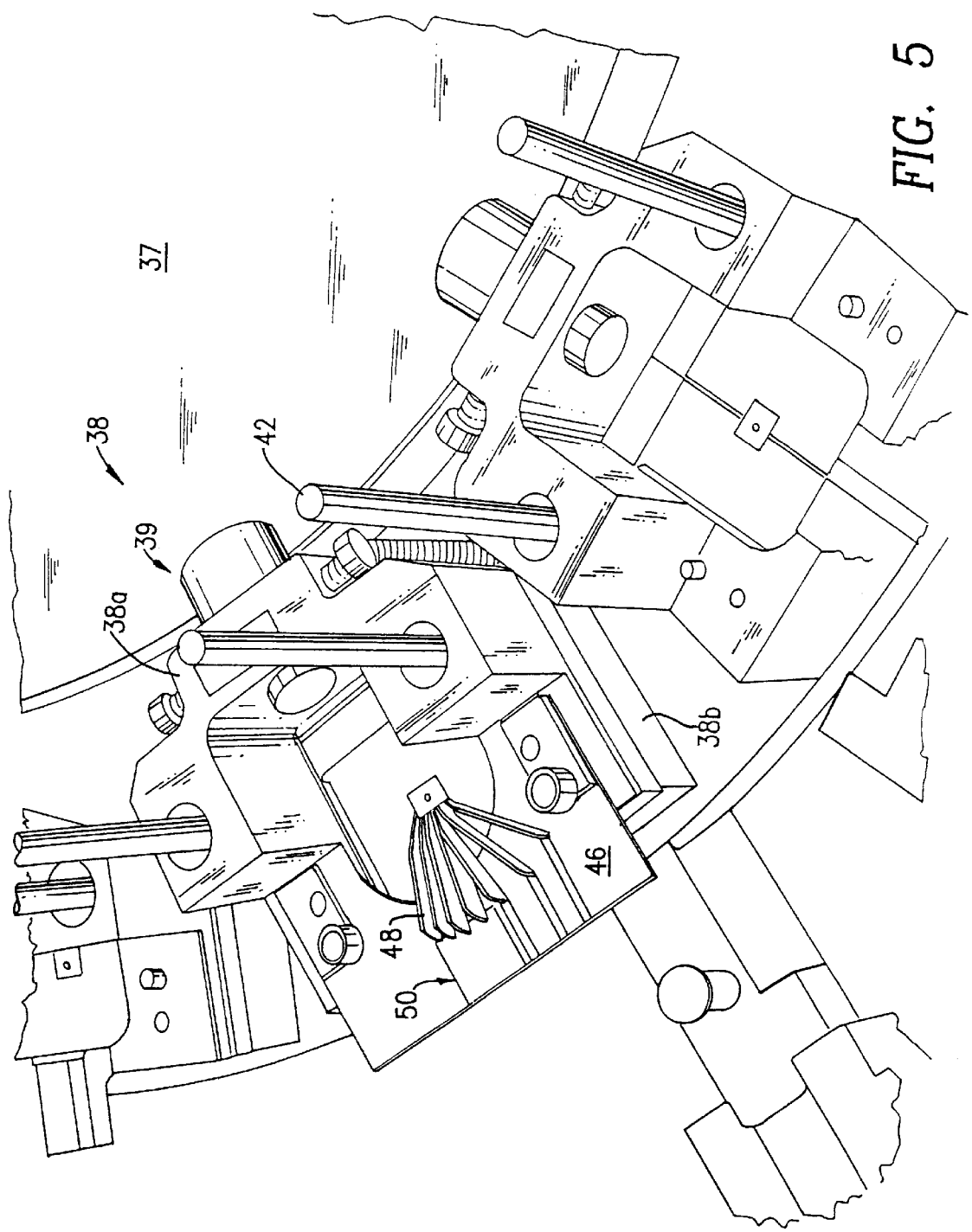
FIG. 5 shows a view of two of the test stations of FIG. 4.

Referring to FIG. 5, each test station 38 preferably includes a probe card 46 which is coupled to the upper portion 38a of the test station 38. The probe card 46 includes one or more needles 48 (preferably formed from tungsten). The needles 48 provide electrical connections between the metalization on the die 40 and edge connectors 50 on the probe card 46.

Figure 6:
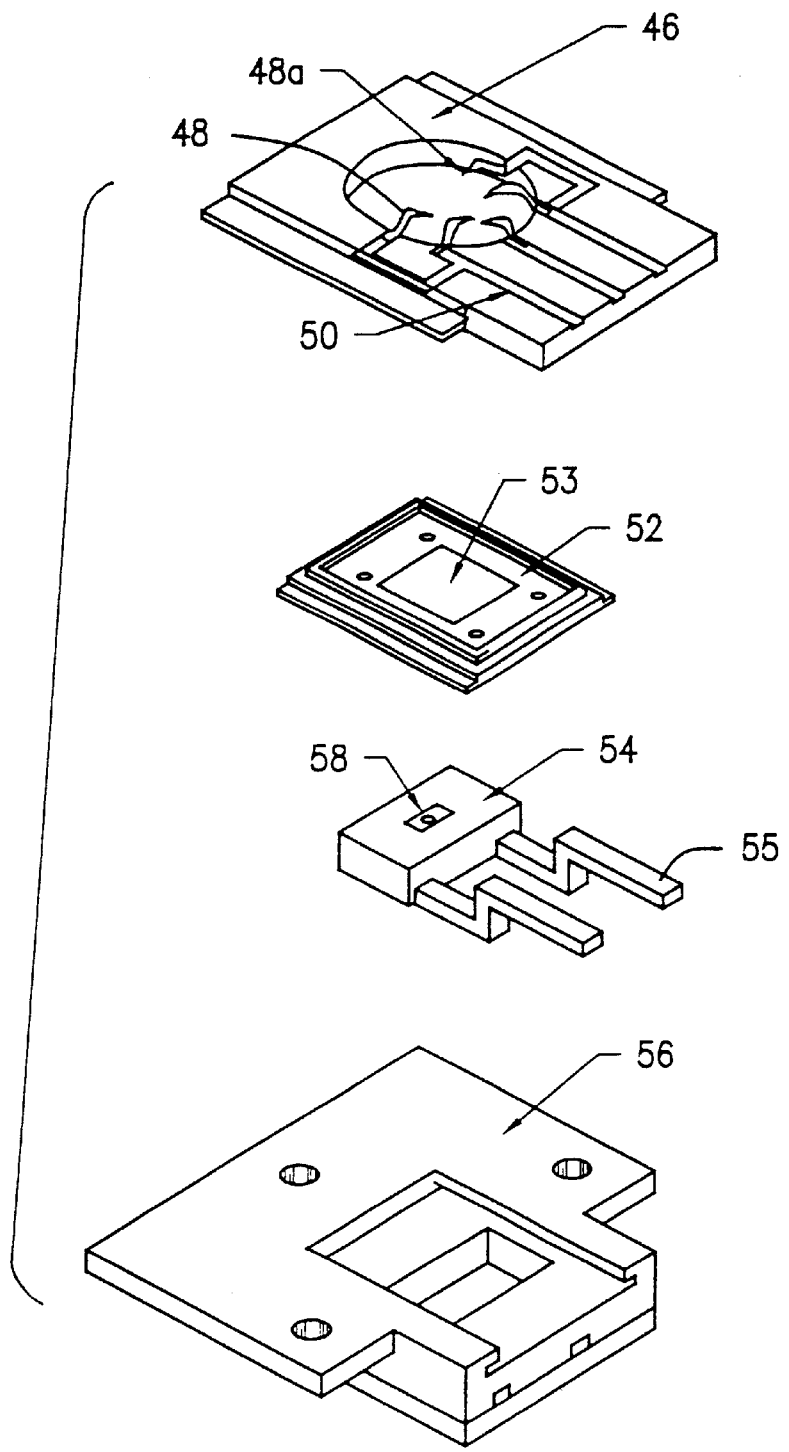
FIG. 6 shows an exploded view of a test nest of a test station in accordance with the invention.

With reference to FIG. 6, each test station 38 preferably includes a test nest which includes a bottom plate 56 in which a pedestal lead 54 may be disposed. The pedestal lead 54 is preferably formed from electrically conducting material (such as brass) and includes an aperture 58 for providing a vacuum. A die alignment insert 52 is placed on the bottom plate 56 such that the pedestal lead 54 is sandwiched between the bottom plate 56 and the die alignment insert 52. The die alignment insert 52 includes an aperture 53 which is sized and shaped to receive the singulated die 40.

The vacuum aperture 58 ensures that the die 40 makes good intimate and electrical contact with the pedestal lead 54. Thus, the terminals 55 of the pedestal lead 54 provide electrical connection with the metalization on the bottom side of the die 40. When the probe card 46 is placed atop of the die alignment insert (when the top portion 38a of the test station 38 is closed) the tips 48a of the needles 48 engage the metalization on the top surface of the die 40.

Figure 7A:
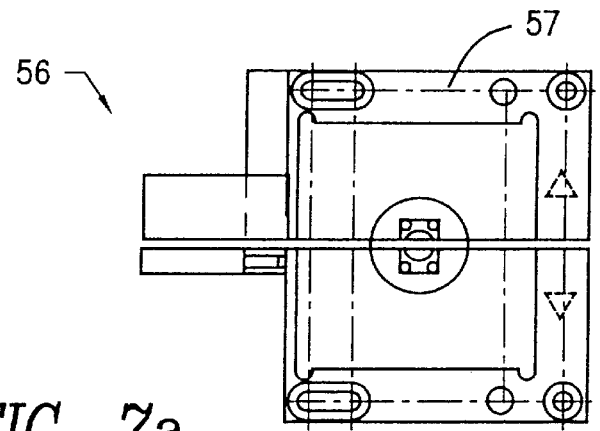
Figure 7B:
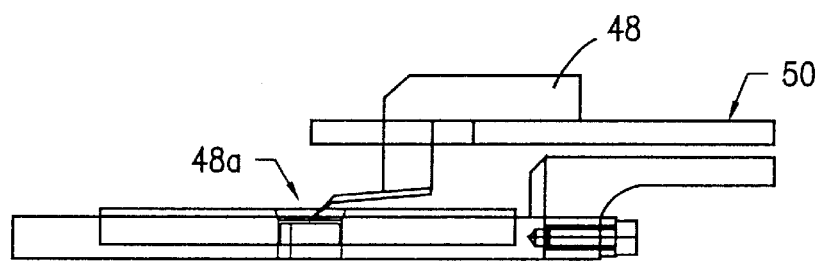
Figure 7C:
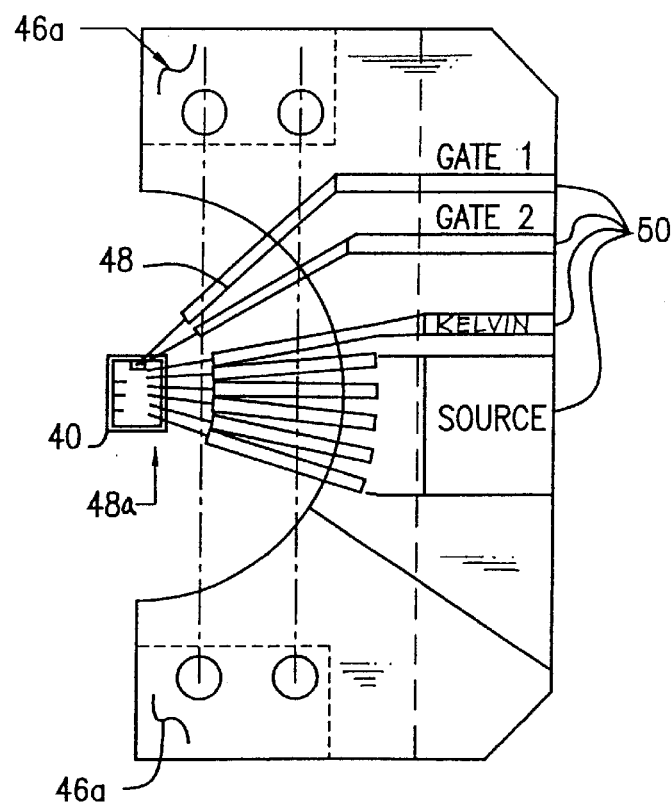
Figure 7F:
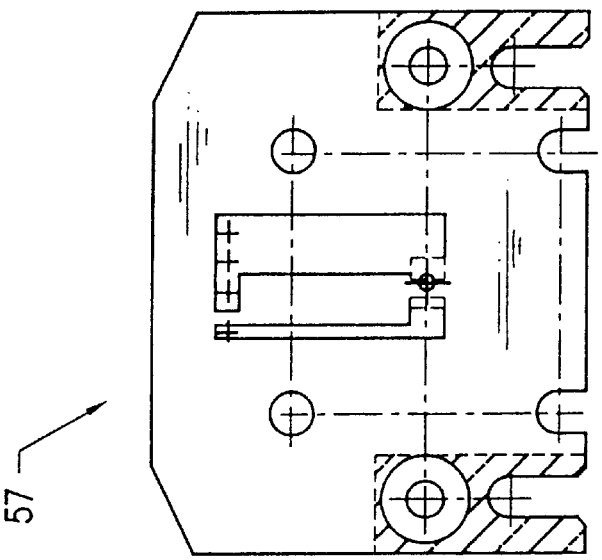
Figure 7E:
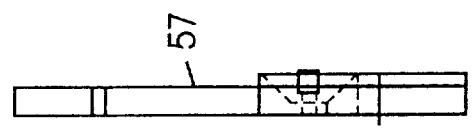
Figure 7D:
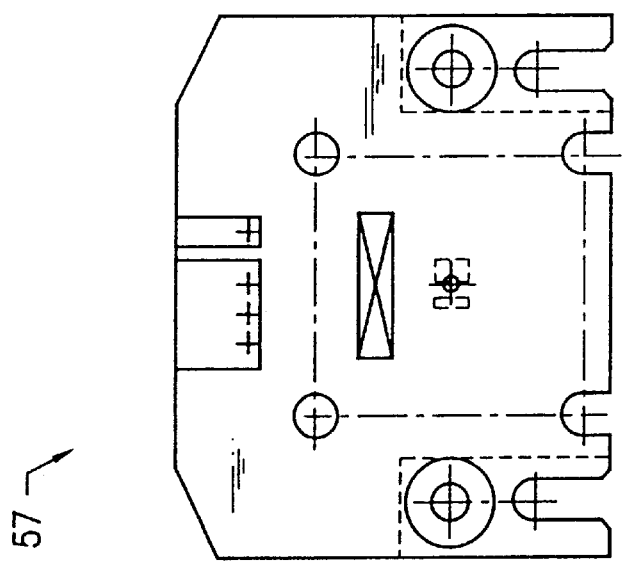

FIGS. 7a–c show a general configuration for the bottom plate 56, probe card 46, and needles 48 of the test nest of the present invention. The bottom plate 56 is preferably formed from isolating plastic (most preferably, ULTEM 1000) surrounded by an aluminum body 57. FIGS. 7d–f are top, side and bottom views, respectively, showing a preferred configuration of the aluminum body 57 of bottom plate 56. FIGS. 7g–i are top and side views, respectively, showing a preferred configuration of the isolation plastic of bottom plate 56.

The probe card 46 is preferably formed from glass epoxy and is coupled to the upper portion 38a of the test station 38 by way of cold rolled brass plates at the corners 46a of the probe card 46. FIG. 7c shows a "½ round" probe card. Preferably, a full round probe card is employed (FIG. 7g).

When the die 40 is an FET, it is preferred that a plurality of needles 48 be provided to make contact with gate 1, gate 2, kelvin sense, and source metalization pads on the die 40. As the source will carry a substantial amount of current, several needles 48 make contact with the source (preferably five needles).

Referring to FIG. 7b, each needle 48, on one end, includes a substantially stiff yet somewhat elastic point 48a which contacts the metalization of the die 40. On an opposite end, each needle 48 terminates at edge connectors 50 which may be readily accessed by a test mechanism. The needles 48 are preferably formed from tungsten and the edge connectors are preferably formed from brass. It is preferred that the body of the needles 48 be about 1.6 mm wide and that the point 48a of the needles 48 measure about 0.0762 mm.

Figure 8A:
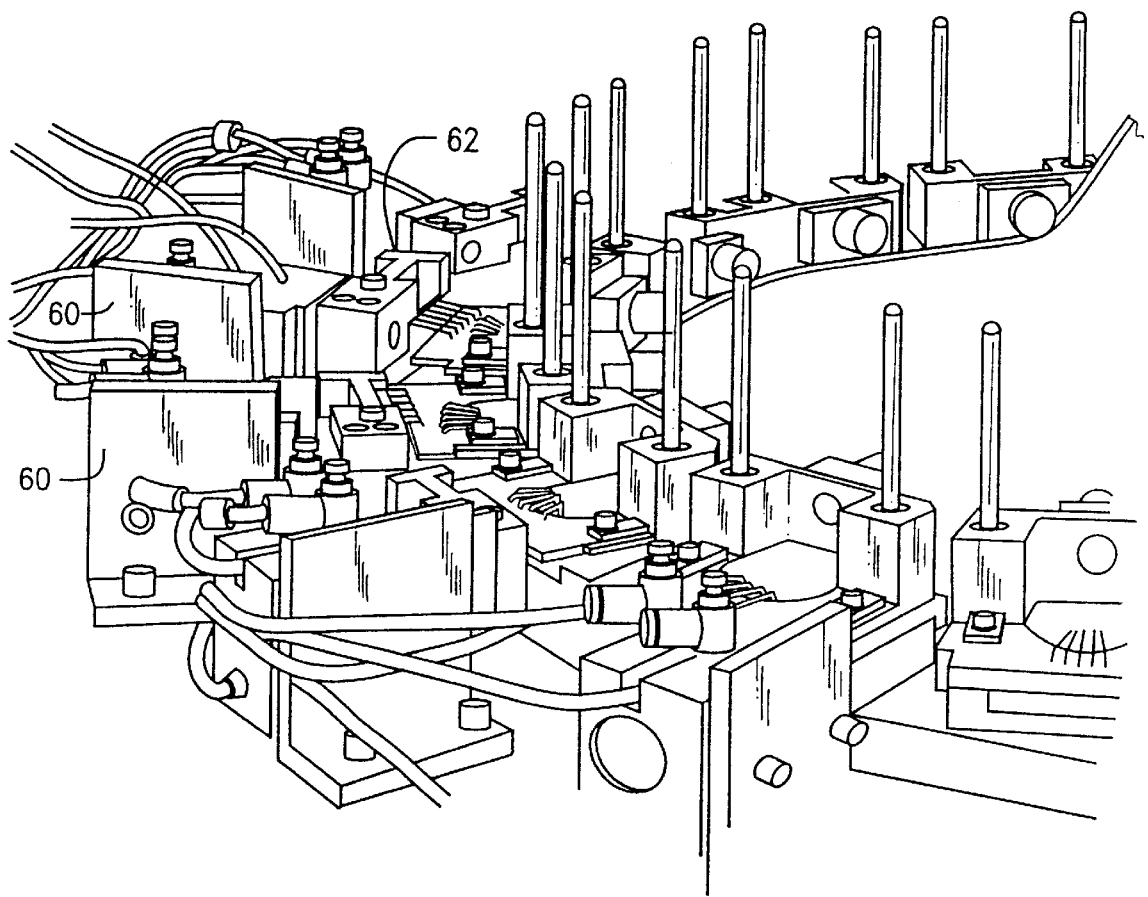
FIGS. 8a–b show perspective views of electrical testing units of the handler of the present invention.
Figure 8B:
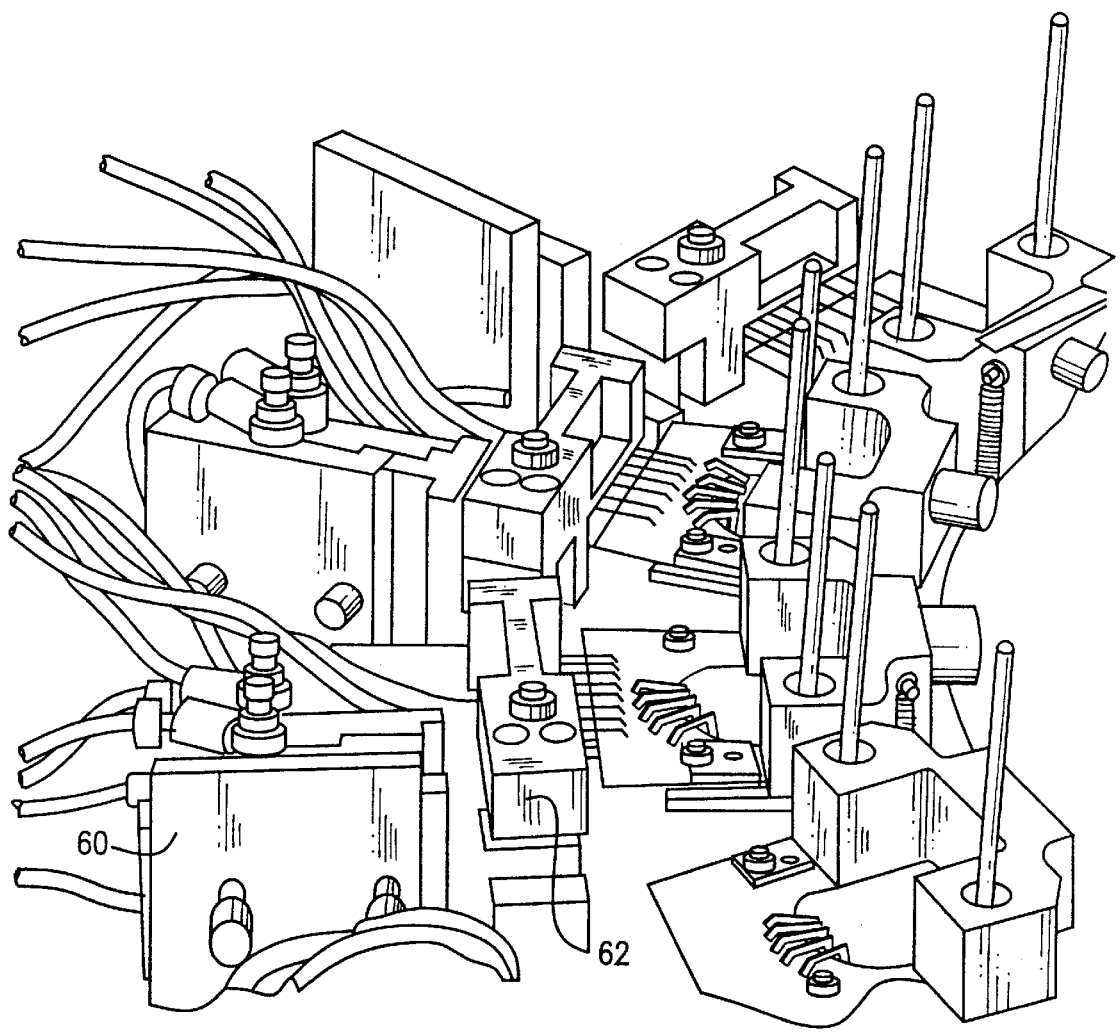

Reference is now made to FIGS. 8a–8b which show that at least one and preferably a plurality of electrical test units 60 are provided at the periphery of the table 37 and oppositely disposed from the test stations 38. The electrical test units 60 are operable to engage the edge connectors 50 of the probe cards 46 via automated clamping mechanisms 62 (best seen in FIG. 8b).

Figure 9A:
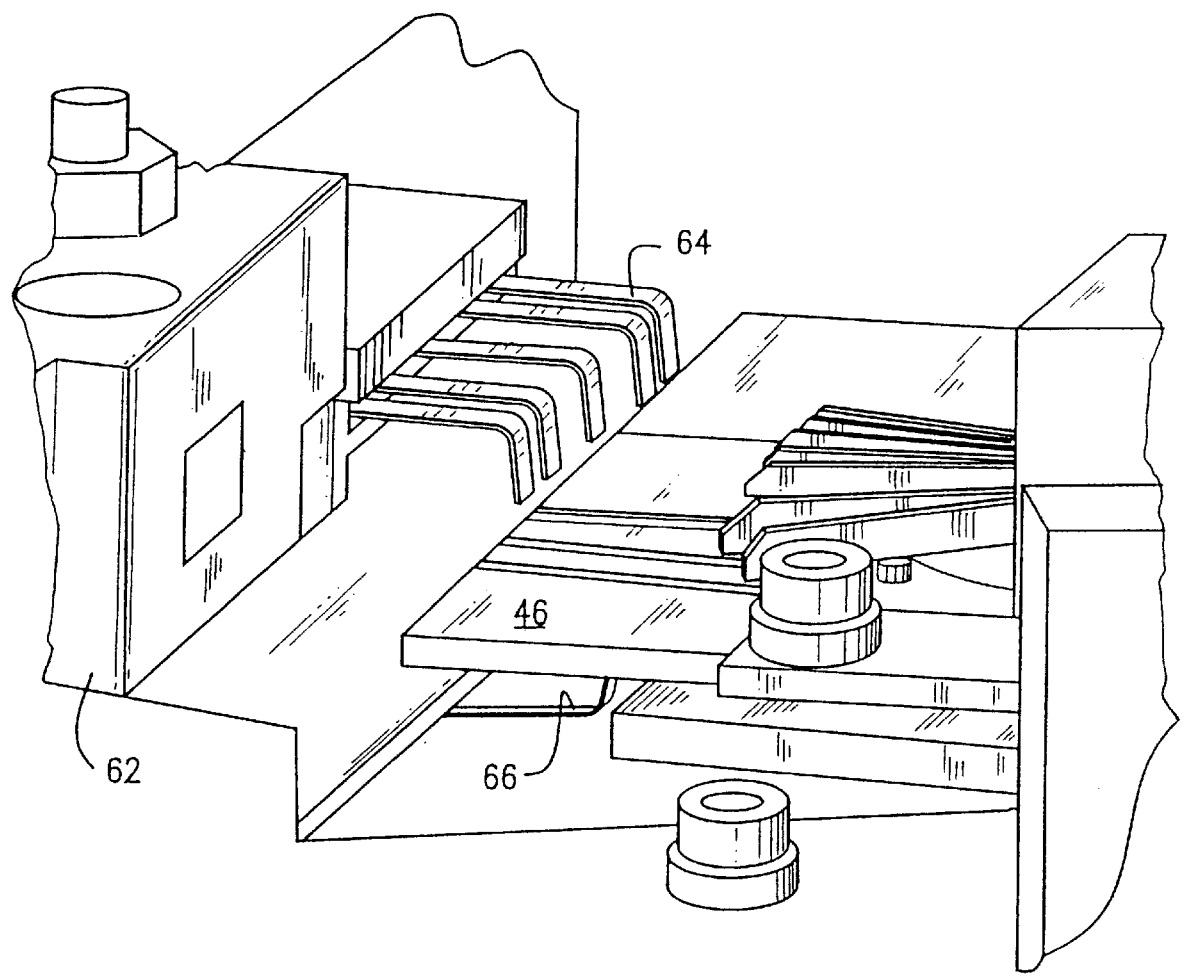
FIGS. 9a–b show more detailed views of clamping elements of the testing units of FIGS. 8a–b.
Figure 9B:
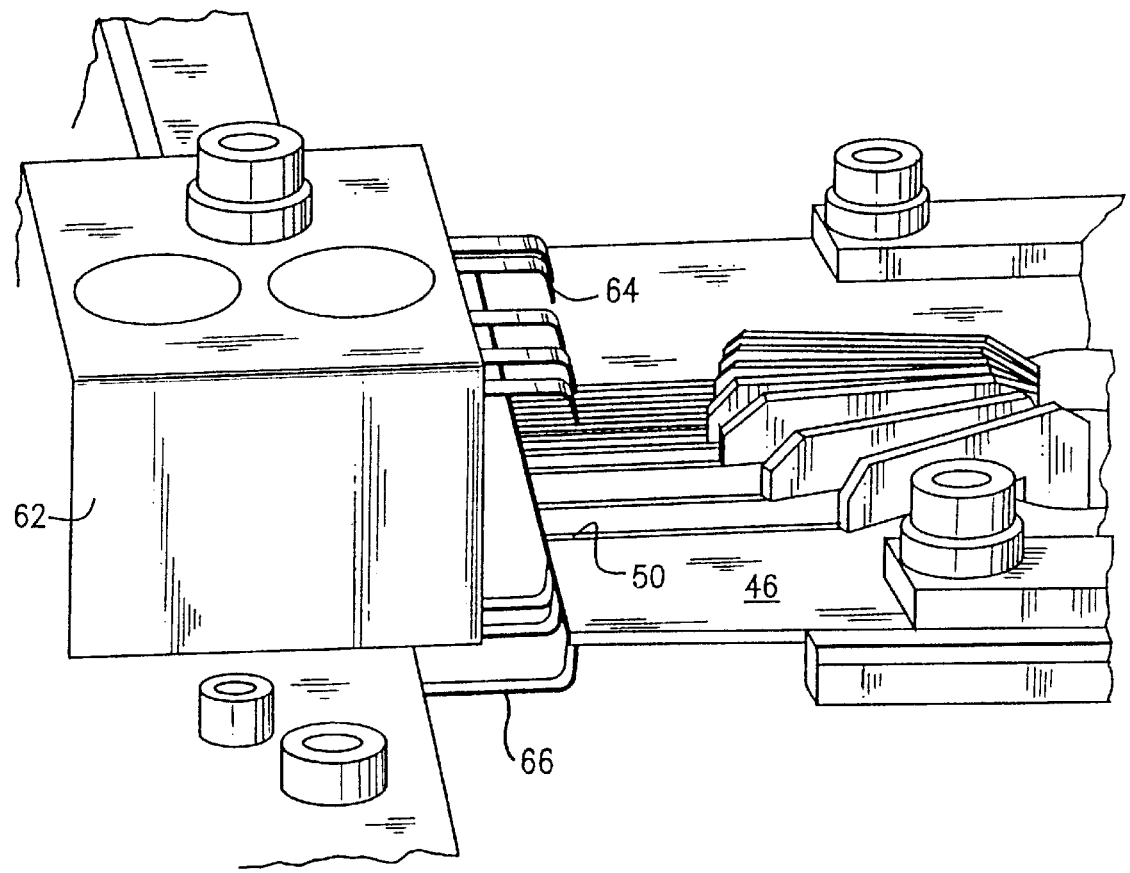

Referring to FIGS. 9a and 9b, each clamping mechanism 62 includes an upper set of engagement pins 64 and a lower set of test pins 66. The upper test pins 64 are preferably oppositely disposed from the lower test pins 66 such that the test pins 64, 66 form a set of jaws which may automatically clamp onto the probe card 46 and make electrical connections with the edge connectors 50.

Figure 9C:
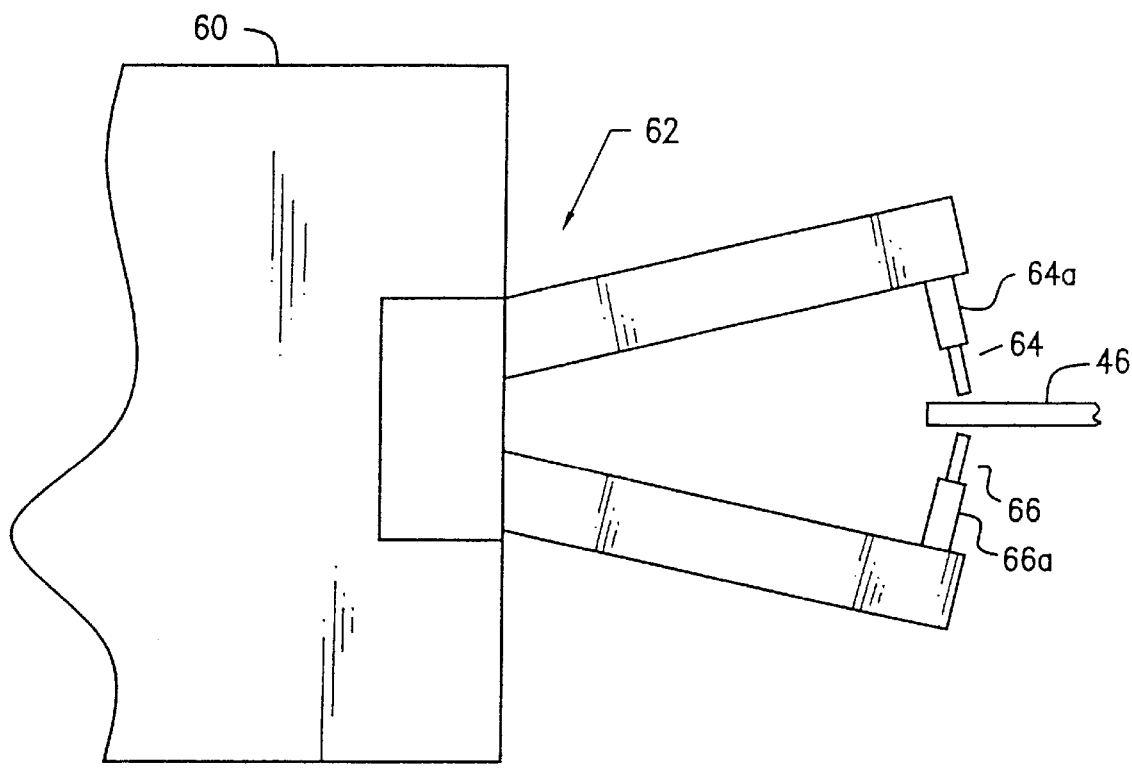
FIGS. 9c shows a view of an alternative clamping element of the testing units of FIGS. 8a–b.

FIG. 9c is a side view of an alternative clamping mechanism 62 which includes upper and lower sets of engagement pins 64, 66, where each pin is telescoped and provides longitudinal elasticity (similar to a pogo-stick arrangement). The upper test pins 64 are preferably oppositely disposed from the lower test pins 66 such that the test pins 64, 66 form a set of jaws which may automatically clamp onto the probe card 46. Those skilled in the art will understand that the telescoped engagement pins are biased outward (for example, by a spring within each shaft 64a, 66a). The pins resiliently telescope into the respective shafts 64a, 66a when the pins engage the card 46.

Preferably, each electrical test unit 60 is associated with a separate electrical test (or group of electrical tests) to be performed on a particular die 40. Thus, as a particular test station 38 rotates about the table 37, the die 40 therein is tested by a plurality of electrical test units 60 and associated test circuitry (not show) and, therefore, is subject to a battery of tests.

As will be apparent to one skilled in the art from the above teaching, the needles 48 engage the die 40 but one time (when the upper portion 38a closes down on the die 40) and, therefore, minimizes the possibility of damaging the metalization on the die 40 due to repeated engagement. Further, proper alignment between the needles 48 and the metalization of the die 40 is ensured which permits high current testing of the die 40.

The basic operation of the KGD handler 10 is as follows: After wafer probe has been completed and the die 40 have been singulated, non-inked die 40 (known as "good die") are picked up by the pick and place apparatus 32 and inspected for mechanical defects such as chipped die, missing patterns, etc. The die 40 are then placed into the flipping device 34 where they are flipped if necessary.

Next, each die 40 is placed on an open test nest of a test station 38. The test stations 38 are then closed and the needles 48 make contact with the respective die 40. The test stations 38 are indexed through the electrical test units 60 and are subjected to electrical testing.

After the KGD handler 10 has indexed a particular test station 38 through all of the electrical test units 60, the testing station 38 is opened and the die 40 is removed from the test nest to be subsequently packaged.

Figure 10:
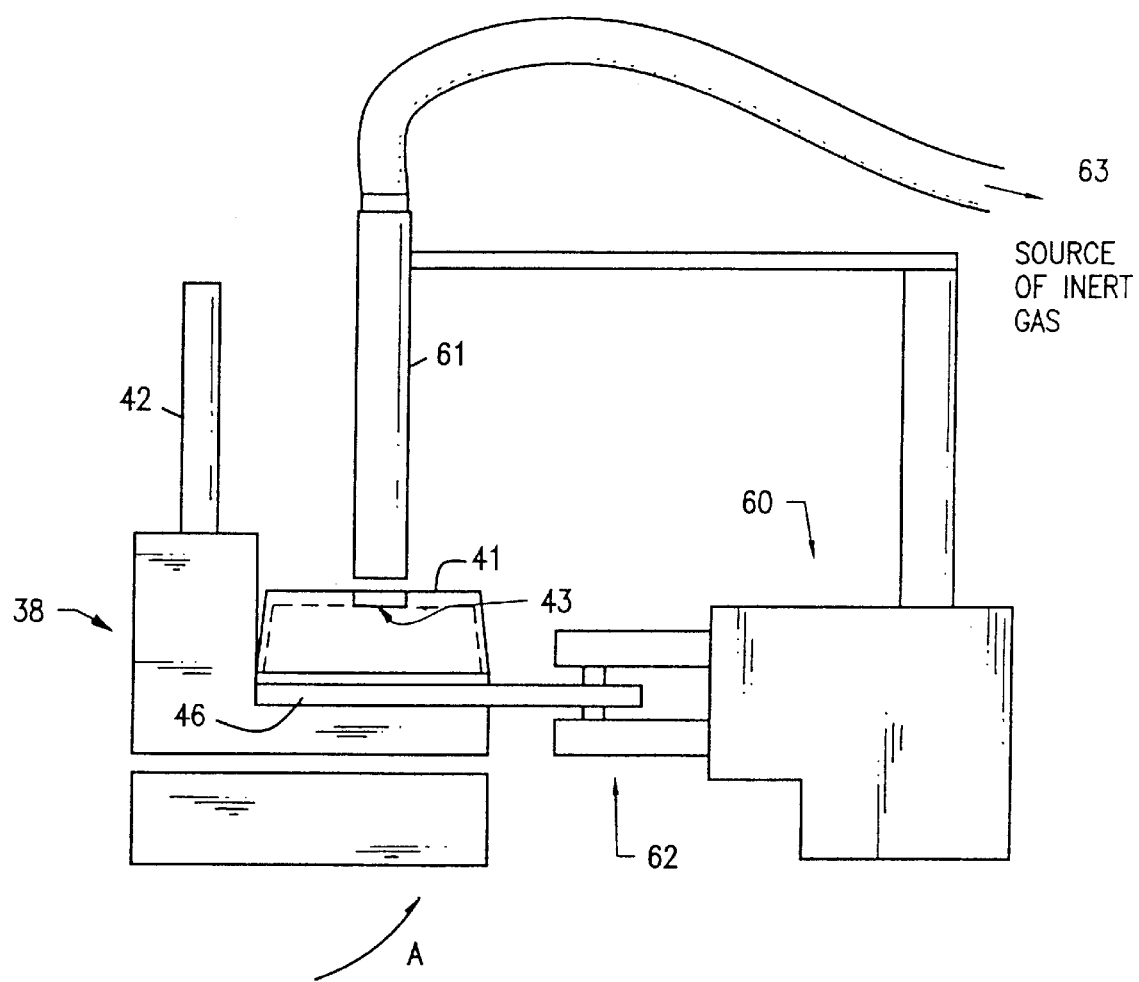
FIG. 10 shows a side view of an alternative configuration for the test units of the present invention.

With reference to FIG. 10, it is preferred that at least some of the test units 60 perform tests in an inert inter gas environment. A shown, a test nest 38 includes at least one cover member 41 coupled to or near the probe card 46 such that the probe card 46 is covered. The cover member 41 includes a port 43 for providing fluid communication between an interior volume defined in part by the cover member 41 and a source of substantially inert gas. The cover member 41 is sized and shaped to define the volume to at least enclose the top side of the semiconductor die under test within the nest 38.

The test unit 60 includes a source of substantially inert gas 63 and the port 43 of the cover member 41 communicates with the source of substantially inert gas 63 via a substantially fixed conduit 61 for channeling the gas toward the test nest 38. The conduit 61 is elongated and disposed substantially vertically towards the port 43.

The port 43 of the cover member 41 is preferably disposed on a top surface thereof such that the conduit 61 communicate with the port 43 and the substantially inert gas is directed into the volume and downwardly onto the top surface of the semiconductor die when the test unit is in the closed position.

Those skilled in the art will appreciate that the conduit 61 of the test unit 60 communicates with the port 43 of the cover member 41 when the test nest moves adjacent the test unit (e.g., in the direction of arrow A). The test unit is preferably synchronized with the position of the test nest 38 such that the gas is not released into the volume until the test is performed.

Advantageously the test nest 38 of the present invention provides more precise contact between the needles 48 and the die 40 (as compared to wafer probe) for current injection because, as the die are singulated, effects from wafer warpage are not a factor. This minimizes localized heating.

The size and shape of the needles 48 provide for high current testing which enables improved qualitative testing over a shorter period of time. Die testing from 0 to about 60 amperes or higher may be performed.

Since the die 40 are singulated, intimate electrical connection to the backside (the drain when the die is an FET) is obtained and, therefore, accurate measurements for both Rdson and Vsd may be obtained. Since leakage tests are performed after the die 40 have been processed from the wafer stage to the singulated die, accurate measurements of the leakages (for example, drain and gate leakages for an FET) may be obtained.

Further, the number of repeated engagements between the needles 48 and the metalization of the die 40 is minimized (preferably only one contact is made) which reduces the chances of significant probe mark damage or die failure.

The testing of singulated die permits temperature testing at hot, cold, and room temperatures while minimizing the possibility of probe damage to the metalization of the die 40 from repeated engagement from repeated engagement from probing the die metalization.

Both UIS and dynamic switching testing (of for example IGBTs) is obtained because there is no significant limitation as to testing currents and no interference from other die of the wafer.

The foregoing description of the embodiments of the present invention have been provided for the purposes of illustration and description. They are not intended to be exhaustive or to limit the invention to the precise forms disclosed. Many modifications and variations are possible in light of the above teaching. It is intended that the scope of the invention be limited not by this detailed description, but rather by the claims appended hereto.

What is claimed is:

1. A known good die testing apparatus for pre-package testing singulated semiconductor die, the testing apparatus comprising:
   a plurality of test nests each for receiving a singulated semiconductor die, each test nest including first and second portions which are movable away from one another to receive the singulated die, the first portion having a probe card coupled thereto which includes at least one needle for electrically connecting to a first side of a semiconductor die and at least one first electrical contact pad coupled to a respective needle; and
   at least one test unit having at least one electrical member in movable communication with the at least one first electrical contact pad to make electrical contact with the same during a testing of a die, the test unit including at least one electrical circuit for performing electrical tests on the semiconductor die.

2. The known good die testing apparatus of claim 1, wherein the first and second portions are adapted to move away from one another to a substantially open position to receive or release the singulated die and to move towards one another to a substantially closed position such that the at least one needle electrically connects to the first side of the semiconductor die.

3. The known good die testing apparatus of claim 2, wherein each test nest further includes:
   a base lead for electrically connecting to a second side of the semiconductor die, opposite to the first side; and
   a second edge connector electrically coupled to the base lead,
   the test unit being further adapted to removably engage the first and second edge connectors of the test nests.

4. The known good die testing apparatus of claim 3, wherein each test nest further includes an automated pick-and-place apparatus for transferring a semiconductor die to or removing a semiconductor die from the base lead of a respective test nest when the first and second portions are in the substantially open configuration.

5. The known good die testing apparatus of claim 3, wherein each test nest further includes a vacuum device in communication with the base lead at least when a semiconductor die is transferred thereto, the vacuum device biasing the semiconductor die against the base lead at least until the first and second portions are in the substantially closed configuration.

6. The known good die testing apparatus of claim 5, wherein each base lead includes an aperture adapted to direct the vacuum towards the semiconductor die.

7. The known good die testing apparatus of claim 3, wherein each test nest further includes at least one guide fixed to one of the first and second portions and slidably engaging the other of the first and second portions such that the portions may attain the open and closed positions.

8. The known good die testing apparatus of claim 7, wherein the guide of each test nest includes at least one rod fixed to and extending substantially vertically from the first portion, the second portion including a rod engaging portion for slidably engaging the at least one rod.

9. The known good die testing apparatus of claim 8, wherein the rod engaging portion is an aperture extending through a part of the second portion.

10. The known good die testing apparatus of claim 3, wherein each test nest further includes at least one biasing element operable to bias the first and second portions towards one another such that, without external force applied thereto, the portions will tend to attain the substantially closed position.

11. The known good die testing apparatus of claim 10, wherein the biasing element includes at least one spring having one end fixed to the first portion and an opposite end fixed to the second portion, the spring biasing the first and second portions towards one another.

12. The known good die testing apparatus of claim 2, wherein each test nest includes an adjustable stop mechanism operable to adjust the degree to which the first and second portions may be moved towards one another.

13. The known good die testing apparatus of claim 3, wherein each probe card includes at least one needle for connecting to a source metalization on a first side of a MOSFET semiconductor die, at least one needle for connecting to a gate metalization on the first side of the MOSFET semiconductor die, and the base lead is adapted to connect to a drain metalization on a second side of the MOSFET semiconductor die, the second side being opposite to the first side.

14. The known good die testing apparatus of claim 13, wherein each probe card includes at least two needles for making a Kelvin sense connection to the MOSFET semiconductor die.

15. The known good die testing apparatus of claim 3, wherein each test unit includes first and second engagement members which are oppositely disposed and movable toward one another to achieve a substantially open or closed position, each engagement member including at least one terminal for connecting to a respective edge connector of the probe card when the engagement members are in the substantially closed position.

16. The known good die testing apparatus of claim 15, wherein the first and second engagement members form a pair of jaws for electrically coupling the electrical circuit of the test unit to the semiconductor die when the jaws are in the closed position.

17. The known good die testing apparatus of claim 15, wherein the terminals resiliently engage the respective edge connectors.

18. The known good die testing apparatus of claim 15, wherein the terminals include a movable plunger which resiliently engages the respective edge connectors.

19. The known good die testing apparatus of claim 15, wherein the at least one test unit is substantially fixed and the test nests move into communication therewith such that the terminals may engage the respective edge connectors of the test nests.

20. The known good die testing apparatus of claim 19, wherein:
   each test unit may perform a substantially different test on each semiconductor die when respective test nests move into communication therewith; and
   each semiconductor die need only be contacted one time by the respective needles yet undergoing a plurality of tests.

21. The known good die testing apparatus of claim 2, further comprising a rotatable plate having a periphery, wherein:
   each test nest is disposed at the periphery of the plate and is rotated therewith; and the test units are disposed in a substantially stationary position proximate to the periphery of the plate such that the test nests may communicate with each test unit as they are rotated.

22. The known good die testing apparatus of claim 21, wherein the rotatable plate includes a lifter adapted to bias the first and second portions away from one another as the plate is rotated into a predetermined position such that the semiconductor die may be transferred to or removed from the base leads of respective test nests.

23. The known good die testing apparatus of claim 22, wherein one of the lifter and the test nests include a cam surface adapted to bias the first and second portions away from one another as the plate is rotated into the predetermined position.

24. The known good die testing apparatus of claim 23, wherein the lifter includes the cam surface and one of the first and second portions of the test nests includes a roller, the roller engaging the cam surface such that the first and second portions are biased away from one another as the plate is rotated into the predetermined position.

25. The known good die testing apparatus of claim 13, wherein at least one of the test units include circuitry to perform at least one of the following tests: avalanche testing, reverse breakdown testing, dynamic switch testing, turn on time testing, turn off time testing, high temperature testing, low temperature testing, Rds on testing, and UIS testing.

26. The known good die testing apparatus of claim 7, further comprising at least one cover member coupled to at least one of the first and second portions of at least one of the test nests, the cover member including a port for fluid communication with a source of substantially inert gas, the cover member being sized and shaped to define a volume at least enclosing the first side of the semiconductor die such that a substantially inert gas environment is obtained when the source of substantially inert gas releases inert gas into the volume.

27. The known good die testing apparatus of claim 26, wherein the one cover member is coupled to the first portion of the test nest over the probe card such that the volume substantially encloses the first side of the semiconductor die when the first and second portions of the test nest attain the closed position.

28. The known good die testing apparatus of claim 27, wherein at least one test unit includes a source of substantially inert gas, the port of the cover member communicating with the source of substantially inert gas when the test unit is in a position to engage the first edge connector of the test nest.

29. The known good die testing apparatus of claim 28, wherein the test unit includes a substantially fixed conduit for channeling the substantially inert gas toward the port of the cover member, the conduit communicating with the port when the test unit is in the position to engage the first edge connector of the test nest.

30. The known good die testing apparatus of claim 29, wherein the conduit is elongated and disposed substantially vertically; and the port of the cover member is disposed on a top surface thereof such that the conduit communicate with the port the substantially inert gas is directed into the volume and downwardly onto the first surface of the semiconductor die.

* * * * *